US012550591B2

(12) United States Patent
Li et al.

(10) Patent No.: US 12,550,591 B2
(45) Date of Patent: Feb. 10, 2026

(54) DISPLAY PANEL HAVING PACKAGING LAYER WITH HOLLOWED-OUT STRUCTURE, DISPLAY DEVICE, AND MANUFACTURING METHOD

(71) Applicants: Chongqing BOE Display Technology Co., Ltd., Chongqing (CN); BOE Technology Group Co., Ltd., Beijing (CN)

(72) Inventors: Shuanzhu Li, Beijing (CN); Weixin Meng, Beijing (CN); Chao Yang, Beijing (CN); Desheng Ruan, Beijing (CN); Yucheng Chan, Beijing (CN); Jonguk Kwak, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 480 days.

(21) Appl. No.: 17/921,594

(22) PCT Filed: Jun. 8, 2021

(86) PCT No.: PCT/CN2021/098879
§ 371 (c)(1),
(2) Date: Oct. 26, 2022

(87) PCT Pub. No.: WO2022/012220
PCT Pub. Date: Jan. 20, 2022

(65) Prior Publication Data
US 2023/0172034 A1    Jun. 1, 2023

(30) Foreign Application Priority Data
Jul. 17, 2020   (CN) .......................... 202010690282.8

(51) Int. Cl.
*H10K 59/80* (2023.01)
*H10K 59/12* (2023.01)
*H10K 59/122* (2023.01)

(52) U.S. Cl.
CPC ....... *H10K 59/873* (2023.02); *H10K 59/1201* (2023.02); *H10K 59/122* (2023.02)

(58) Field of Classification Search
CPC . H10K 59/873; H10K 59/1201; H10K 59/122
(Continued)

(56) References Cited

U.S. PATENT DOCUMENTS

2017/0162637 A1\*  6/2017  Choi ................... H10K 59/131
2017/0278920 A1    9/2017  Park et al.
(Continued)

FOREIGN PATENT DOCUMENTS

CN    107039493 A    8/2017
CN    109244039 A    1/2019
(Continued)

OTHER PUBLICATIONS

CN202010690282.8 first office action.
CN202010690282.8 Decision of Rejection.
PCT/CN2021/098879 international search report.

*Primary Examiner* — Xia L Cross
(74) *Attorney, Agent, or Firm* — IPro, PLLC

(57) ABSTRACT

Disclosed are a display panel, a display device, and a manufacturing method. The display panel includes: a base substrate including multiple island regions, an opening region, and a bridge region, each of the island regions having at least one pixel; an inorganic packaging layer on a side of the base substrate, the inorganic packaging layer covering the island regions and the bridge regions and having a first hollowed-out structure, and the orthographic projection of the first hollowed-out structure on the base substrate covering the orthographic projection of the opening regions on the
(Continued)

base substrate; and an organic packaging layer located on the side of the inorganic packaging layer facing away from the base substrate and having a second hollowed-out structure, the orthographic projection of the second hollowed-out structure on the base substrate covering the orthographic projection of the first hollowed-out structure on the base substrate.

20 Claims, 7 Drawing Sheets

(58) Field of Classification Search
USPC .......................................................... 257/40
See application file for complete search history.

(56) References Cited

U.S. PATENT DOCUMENTS

| | | |
|---|---|---|
| 2021/0066650 A1 | 3/2021 | Yu et al. |
| 2021/0257434 A1 | 8/2021 | Xie et al. |

FOREIGN PATENT DOCUMENTS

| | | | |
|---|---|---|---|
| CN | 109935730 A | 6/2019 | |
| CN | 110400891 A | 11/2019 | |
| CN | 111370454 A | 7/2020 | |
| CN | 111799392 A | 10/2020 | |

* cited by examiner

DISPLAY PANEL HAVING PACKAGING LAYER WITH HOLLOWED-OUT STRUCTURE, DISPLAY DEVICE, AND MANUFACTURING METHOD

CROSS-REFERENCE OF RELATED APPLICATIONS

The present application is a National Stage of International Application No. PCT/CN2021/098879, filed Jun. 8, 2021, which claims priority to the Chinese Patent Application No. 202010690282.8, entitled "DISPLAY PANEL, DISPLAY DEVICE, AND MANUFACTURING METHOD", and filed to the China National Intellectual Property Administration on Jul. 17, 2020, the entire contents of which are incorporated herein by reference.

FIELD OF INVENTION

The present disclosure relates to the technical field of display, in particular to a display panel, a display apparatus and a manufacturing method.

BACKGROUND

An organic electroluminescent display (OLED) panel has gradually become a mainstream of the display field with its excellent performance of low power consumption, high color saturation, wide viewing angle, less thickness, being capable of realizing flexibility and the like, which can be widely used in smart phones, flat panel computers, televisions and other terminal products. Flexible OLED products are the most prominent, and gradually become the mainstream of OLED display because they can meet various special structures.

With the development of a flexible technology, it gradually transits from being bendable, foldable to stretchable. Flexible stretchable display has been widely concerned by the market because of its broad application space. At the same time, the development of the flexible stretchable display also faces many technical challenges.

BRIEF SUMMARY

An embodiment the present disclosure provides a display panel, including:

a base substrate, including a plurality of island regions, an opening region arranged between adjacent island regions, and a bridge region connecting with adjacent island regions, each of the plurality of island regions has at least one pixel;

an inorganic packaging layer, disposed on a side of the base substrate, the inorganic packaging region covers the island regions and the bridge regions and the inorganic packaging region is provided with a first hollowed-out structure, an orthographic projection of the first hollowed-out structure on the base substrate covers an orthographic projection of the opening region on the base substrate; and an organic packaging layer, disposed on a side, facing away from the base substrate, of the inorganic packaging layer, the organic packaging layer is provided with a second hollowed-out structure, and an orthographic projection of the second hollowed-out structure on the base substrate covers the orthographic projection of the first hollowed-out structure on the base substrate.

In some embodiments, the organic packaging layer is an optical adhesive layer.

In some embodiments, the base substrate is provided with a groove structure in the opening region; and in a direction perpendicular to the base substrate, a depth of the groove structure is smaller than a thickness of the base substrate.

In some embodiments, the base substrate is provided with a through groove structure in the opening region; and in a direction perpendicular to the base substrate, a depth of the through groove structure is equal to a thickness of the base substrate.

In some embodiments, a distance, in the island regions, between a face of the organic packaging layer facing the base substrate and a first surface is greater than a distance, in the bridge regions, between the face of the organic packaging layer facing the base substrate and the first surface; where the first surface is a surface, facing the inorganic packaging layer, of the base substrate.

In some embodiments, between the base substrate and the inorganic packaging layer, the display panel in each island region further includes:

a first metal layer;

a first passivation layer, disposed on a side, facing away from the base substrate, of the first metal layer;

a first planarization layer, disposed on a side, facing away from the first metal layer, of the first passivation layer;

a second metal layer, disposed on a side, facing away from the first passivation layer, of the first planarization layer;

a second planarization layer, disposed on a side, facing away from the first planarization layer, of the second metal layer; and a second passivation layer, disposed on a side, facing away from the second metal layer, of the second planarization layer;

the second passivation layer is in contact with the first passivation layer through a first isolation groove penetrating through the second planarization layer and the first planarization layer at a boundary of the island region facing the opening region.

In some embodiments, between the base substrate and the inorganic packaging layer, the display panel in each island region further includes:

a pixel defining layer, disposed on a side, facing away from the second planarization layer, of the second passivation layer ;

in a region between a boundary of the island regions and a region where a pixel is located, the inorganic packaging layer is filled with a second isolation groove penetrating through the pixel defining layer, the second passivation layer and a part of the second planarization layer.

In some embodiments, between the base substrate and the inorganic packaging layer, the display panel in each bridge region further includes:

a first passivation layer;

a first planarization layer, disposed on a side, facing away from the base substrate, of the first passivation layer;

a second planarization layer, disposed on a side, facing away from the first passivation layer, of the first planarization layer; and a second passivation layer, disposed on a side, facing away from the first planarization layer, of the second planarization layer;

the second passivation layer is in contact with the first passivation layer through a third isolation groove penetrating through the second planarization layer and the first planarization layer at a boundary of the bridge region facing the opening regions.

In some embodiments, between the base substrate and the inorganic packaging layer, the display panel in the bridge region further includes:

the first planarization layer;

the second planarization layer, disposed on a side, facing away from the base substrate, of the first planarization layer; and the second passivation layer, disposed on the side, facing away from the first planarization layer, of the second planarization layer ;

the inorganic packaging layer in the bridge region is filled with a fourth isolation groove penetrating through the second passivation layer and a part of the second planarization layer.

In some embodiments, between the second planarization layer and the inorganic packaging layer, the display panel in a region where a pixel is located further includes:

an anode; and an organic light emitting layer, arranged between the anode and the inorganic packaging layer.

In some embodiments, between the base substrate and the first metal layer, the display panel in each island region further includes:

a buffer layer;

an active layer, disposed on a side, facing away from the base substrate, of the buffer layer;

a first gate insulation layer, disposed on a side, facing away from the buffer layer, of the active layer;

a gate, disposed on a side, facing away from the active layer, of the first gate insulation layer;

a second gate insulation layer, disposed on a side, facing away from the first gate insulation layer, of the gate; and an interlayer dielectric layer, disposed on a side, facing away from the gate, of the second gate insulation layer.

In some embodiments, each island region is a rectangle, part of at least one side edge of the island region communicates with adjacent island region through the bridge regions, and the rest part of the island region is surrounded by the opening regions with a same extension direction as the at least one side edge.

An embodiment of the present disclosure further provides a display apparatus, including the display panel provided by the embodiment of the present disclosure.

An embodiment of the present disclosure further provides a manufacturing method of the display panel provided by the embodiment of the present disclosure, including:

providing a base substrate, wherein the base substrate comprises a plurality of island regions, an opening region arranged between adjacent island regions, and a bridge region connecting with adjacent island regions, and each of the plurality of island regions has at least one pixel;

forming an inorganic packaging layer on a side of the base substrate, and patterning the inorganic packaging layer to form a first hollowed-out structure, wherein an orthographic projection of the first hollowed-out structure on the base substrate covers an orthographic projection of the opening region on the base substrate; and forming an organic packaging layer on a side, facing away from the base substrate, of the inorganic packaging layer, and patterning the organic packaging layer to form a second hollowed-out structure, wherein an orthographic projection of the second hollowed-out structure on the base substrate covers the orthographic projection of the first hollowed-out structure on the base substrate.

DETAILED DESCRIPTION OF THE EMBODIMENTS

In order to make objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. Based on the described embodiments of the present disclosure, all other embodiments obtained by those ordinarily skilled in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the similar words used in the present disclosure do not indicate any order, quantity or importance, but are merely used to distinguish different components. The words "comprise" or "include" and the like indicate that an element or item appearing before such the word covers listed elements or items appearing after the word and equivalents thereof, and does not exclude other elements or items. The words "connect" or "connected" or the like are not limited to physical or mechanical connection, but may include electrical connection, whether direct or indirect. "Upper", "lower", "left", "right" and the like are only used to represent relative position relationships, and the relative position relationships may also change accordingly after an absolute position of a described object is changed.

In order to keep the following descriptions of the embodiments of the present disclosure clear and concise, detailed descriptions of known functions and known components are omitted.

Figure 1:
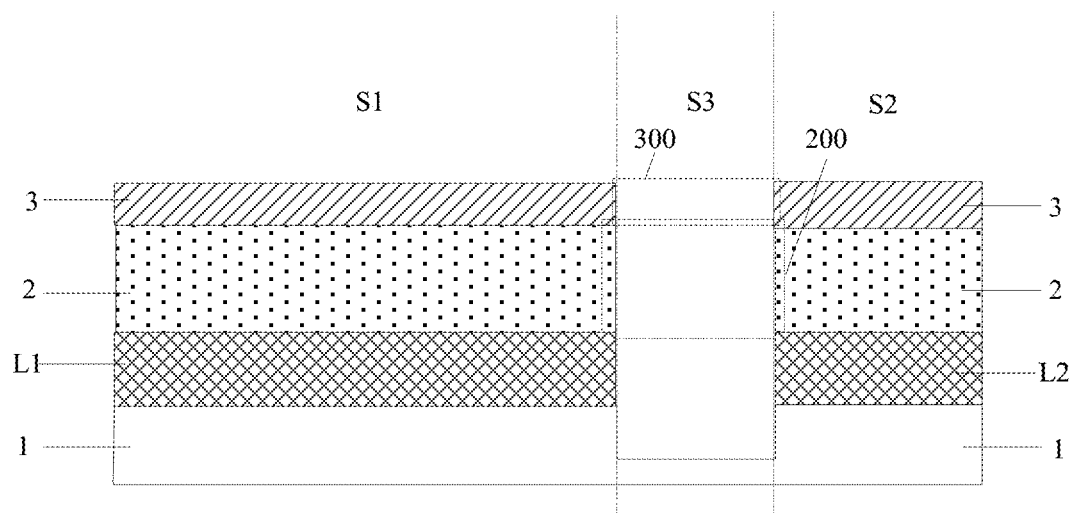
FIG. 1 is a schematic sectional view of a display panel provided by an embodiment of the present disclosure.
Figure 2:
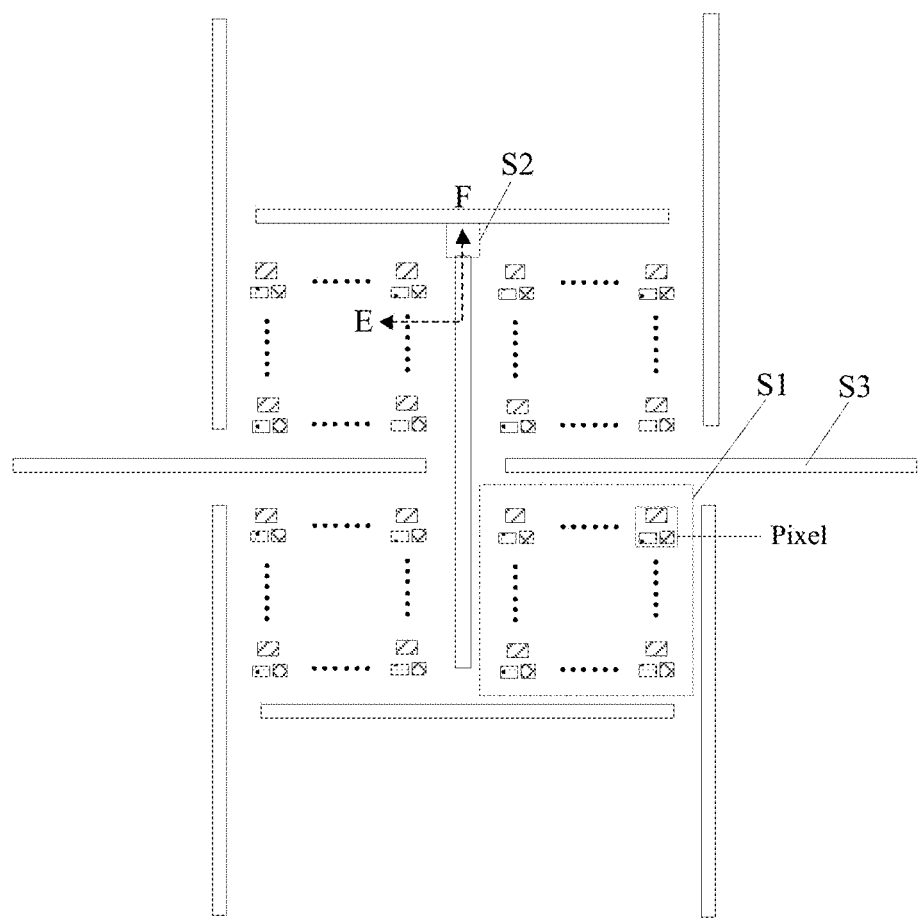
FIG. 2 is a schematic top view of a display panel provided by an embodiment of the present disclosure.

Referring to FIG. 1 and FIG. 2, FIG. 1 is a schematic sectional view of FIG. 2 at EF, and an embodiment the present disclosure provides a display panel, including:

a base substrate 1, including a plurality of island regions S1, an opening region S3 arranged between adjacent island regions S1, and a bridge region S2 connecting with adjacent island regions S1, where each of the plurality of island regions S1 has at least one pixel, and each bridge region S2 has a signal line (not shown in figure, In some embodiments may be a grid line, a data line or a power line) connecting the pixels in the adjacent island regions S1; in some embodiments, each island region S1 may be a rectangle, each opening region S3 may be a strip, each strip-shaped opening region S3 may be located at a gap between two adjacent island regions S1, and an extension direction may be the same as an extension direction of a side edge of each island region S1; and each pixel may include a red sub-pixel, a green sub-pixel and a blue sub-pixel;

an inorganic packaging layer 2, disposed on a side of the base substrate 1, where the inorganic packaging layer 2 covers the island regions S1 and the bridge regions S2 and the inorganic packaging region is provided with a first hollowed-out structure 200, and an orthographic projection of the first hollowed-out structure 200 on the base substrate 1 covers an orthographic projection of each opening region S3 on the base substrate 1; and in some embodiments, the orthographic projection of the first hollowed-out structure 200 on the base substrate 1 coincides with the orthographic projection of each opening region S3 on the base substrate 1, that is, as shown in FIG. 2, when each opening region S3 is a strip that encloses the island regions S1, the first hollowed-out structure 200 is also a strip that encloses the island regions S1, and a pattern of the first hollowed-out structure 200 is the same as a pattern of each opening region S3; and an inorganic packaging layer 3, disposed on a side of the inorganic packaging layer 2 facing away from the base substrate 1, and the organic packaging layer is provided with a second hollowed-out structure 300, an orthographic projection of the second hollowed-out structure 300 on the base substrate 1 covers the orthographic projection of the first hollowed-out structure 200 on the base substrate 1; and in some embodiments, the orthographic projection of the second hollowed-out structure 300 on the base substrate 1 coincides with the orthographic projection of the first hollowed-out structure 200 on the base substrate 1, that is, a pattern of the second hollowed-out structure 300 is the same as the pattern of the first hollowed-out structure 200, as well as the pattern of each opening region S3.

In the embodiment of the present disclosure, the inorganic packaging layer has the first hollowed-out structure, and the orthographic projection of the first hollowed-out structure on the base substrate coincides with the orthographic projection of each opening region on the base substrate. Compared with the display panel packaged with only a whole layer of inorganic packaging layer, the problem that the inorganic packaging layer is prone to cracking in the opening regions when the display panel is stretched may occur. However, according to the display panel provided by the embodiment of the present disclosure, by removing the inorganic packaging layer of the opening regions, the problem that the inorganic packaging layer is prone to cracking in the opening regions when the display panel is stretched can be avoided. In addition, the organic packaging layer is further arranged on the side of the inorganic packaging layer facing away from the base substrate, the organic packaging layer has the second hollowed-out structure, the orthographic projection of the second hollowed-out structure on the base substrate coincides with the orthographic projection of the first hollowed-out structure on the base substrate, which can protect the inorganic packaging layer and reduce the probability of crack of the inorganic packaging layer covering the island regions and bridge regions. Moreover, the organic packaging layer and the inorganic packaging layer are also not arranged in the opening regions, which can ensure that the display panel has a good stretchable performance, and avoid the problem that the display panel is not easy to stretch when more film layers are arranged in the opening regions at the same time.

In some embodiments, each island region S1 may further be provided with a composite island region film layer L1 between the inorganic packaging layer 2 and the base substrate 1, and each bridge region S2 may further be provided with a composite bridge region film layer L2. For example, referring to FIG. 3, each island region S1, between the base substrate 1 and the inorganic packaging layer 2, is sequentially provided with (that is, the island region film layer L1 may include) a buffer layer 10, an active layer 11, a first gate insulation layer 12, a gate 13, a second gate insulation layer 14, an interlayer dielectric layer 15, a first metal layer 4 (may include a source 41 and a drain 42), a first passivation layer 51, a first planarization layer 61, a second metal layer 7 (may include a source overlapping electrode 71 and a drain overlapping electrode 72, where the source overlapping electrode 71 may be connected to the source 41 through a through hole penetrating through the first planarization layer 61 and a part of the first passivation layer 51, and the source 41 is in contact with one end of the active layer 11 through a through hole penetrating through the interlayer dielectric layer 15, the second gate insulation layer 14 and the first gate insulation layer 12; and the drain overlapping electrode 72 may be connected to the drain 42 through a through hole penetrating through the first planarization layer 61 and part of the first passivation layer 51, and the drain 42 is in contact with the other end of the active layer 11 through a through hole penetrating through the interlayer dielectric layer 15, the second gate insulation layer 14 and the first gate insulation layer 12), a second planarization layer 62, a second passivation layer 52, an anode 16, a pixel defining layer 9, a spacer 19, an organic light emitting layer 17 and a cathode 18 which are located on one side of the base substrate 1. Each bridge region S2, between the base substrate 1 and the inorganic packaging layer 2, is sequentially provided with (that is, the bridge region film layer L2 may include) a buffer layer 10, a first gate insulation layer 12, a second gate insulation layer 14, an interlayer dielectric layer 15, a first passivation layer 51, a first planarization layer 61, a second planarization layer 62 and a second passivation layer 52 which are located on one side of the base substrate 1.

Figure 4:
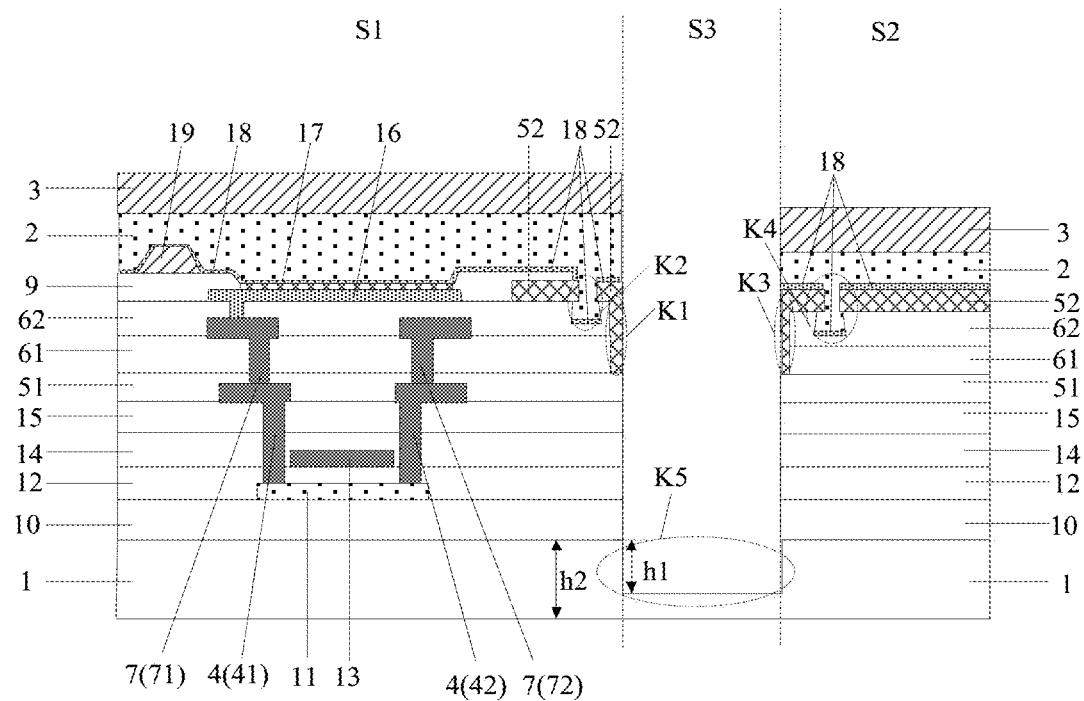
FIG. 4 is a schematic sectional view of another specific display panel provided by an embodiment of the present disclosure.

In some embodiments, referring to FIG. 4, the second passivation layer 52 is in contact with the first passivation layer 51 through a first isolation groove K1 penetrating through the second planarization layer 62 and the first planarization layer 61 at a boundary of the island regions S1 facing the opening regions S3. In the embodiment of the present disclosure, the display panel is provided with the first isolation groove K1 at the boundary of the island regions S1, and the second passivation layer 52 is in contact with the first passivation layer 51 through the first isolation groove K1, which can realize the boundary sealing between the second passivation layer 52 and the first passivation layer 51 at the boundary of the island regions S1, and improve the sealing performance of the display panel at the boundary of the island regions S1.

In some embodiments, the second passivation layer 52 is in contact with the first passivation layer 51 through a third isolation groove K3 penetrating through the second planarization layer 52 and the first planarization layer 51 at a boundary of the bridge regions S2 facing the opening regions S3. In the embodiment of the present disclosure, the display panel is provided with the third isolation groove K3 at the boundary of the bridge regions S2, and the second passivation layer 52 is in contact with the first passivation layer 51 through the third isolation groove K3, which can realize the boundary sealing between the second passivation layer 52 and the first passivation layer 51 at the boundary of the bridge regions S2, and improve the sealing performance of the display panel at the boundary of the bridge regions S2.

In some embodiments, referring to FIG. 4, a region between a boundary of the inorganic packaging layer 2 in the island regions S1 and a region where the pixels are located (namely the region where the anode 16 is located) is filled with a second isolation groove K2 that penetrates through the pixel defining layer 9, the second passivation layer 52 and a part of the second planarization layer 62. In the embodiment of the present disclosure, the display panel is further provided with the second isolation groove K2. On the one hand, the second isolation groove K2 can further enhance the sealing performance of the region where the pixels of the island regions S1 are located through the inorganic packaging layer 2; on the other hand, a common layer in an organic light emitting device may also be blocked (for example, an electron transfer layer may also be arranged between the organic light emitting layer 17 and the cathode 18, which is not shown in FIG. 4, and a pattern of the electron transfer layer may be the same as a pattern of the cathode 18), so as to avoid that if the common layer in the island regions S1 is corroded at the boundary by water oxygen, the external water oxygen may invade the region where the pixels are located in the island regions S1 from the opening regions S3, and then the light emitting display of the region where the pixels are located is affected.

In some embodiments, referring to FIG. 4, in the bridge regions S2, the inorganic packaging layer 2 is filled with a fourth isolation groove K4 that penetrates through the second passivation layer 52 and a part of the second planarization layer 62. In the embodiment of the present disclosure, the display panel is further provided with the fourth isolation groove K4. The fourth isolation groove K4 may block the common layer (for example, a hole injection layer, a hole transfer layer, an electron transfer layer or an electron injection layer, and a pattern of the common layer may be the same as the pattern of the cathode 18) in the organic light emitting device, so as to avoid that the external water oxygen invades the region where the pixels are located in the island regions S1 from the opening regions S3 along the common layer, and then the light emitting display of the region where the pixels are located is affected.

In some embodiments, the organic packaging layer 3 is an optical adhesive layer. Compared with other organic packaging materials that must be used by an inkjet printing process, due to the limited accuracy of the current inkjet printing process, it is impossible to realize non-accurate control over the printing of the organic packaging materials in the opening regions S3, in the embodiment of the present disclosure, the organic packaging layer 3 is the optical adhesive layer, and when the organic packaging layer 3 is patterned to form the second groove structure 300, the organic packaging layer may be patterned by adopting a photoetching (such as wet etching) process. Because the photoetching process has a high accuracy, non-accurate control over manufacturing the organic packaging layer 3 in the opening regions 3 can be realized.

In some embodiments, referring to FIG. 4, the base substrate 1 has a groove structure K5 in the opening regions S3; and in a direction perpendicular to the base substrate 1, a depth h1 of the groove structure K5 is smaller than a thickness h2 of the base substrate 1.

Figure 5:
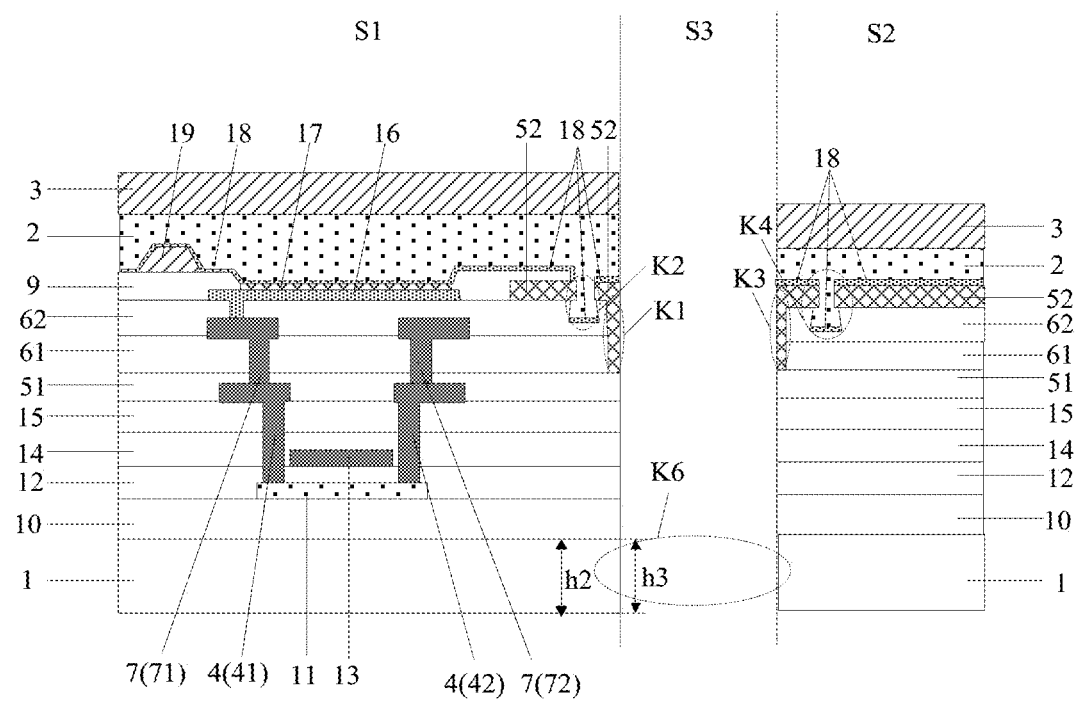
FIG. 5 is a schematic sectional view of a display panel having a through groove structure on a base provided by an embodiment of the present disclosure.

In some embodiments, referring to FIG. 5, the base substrate 1 has a through groove structure K6 in the opening regions S3; and in a direction perpendicular to the base substrate 1, a depth h3 of the through groove structure K6 is the same as a thickness h2 of the base substrate 1.

Figure 6:
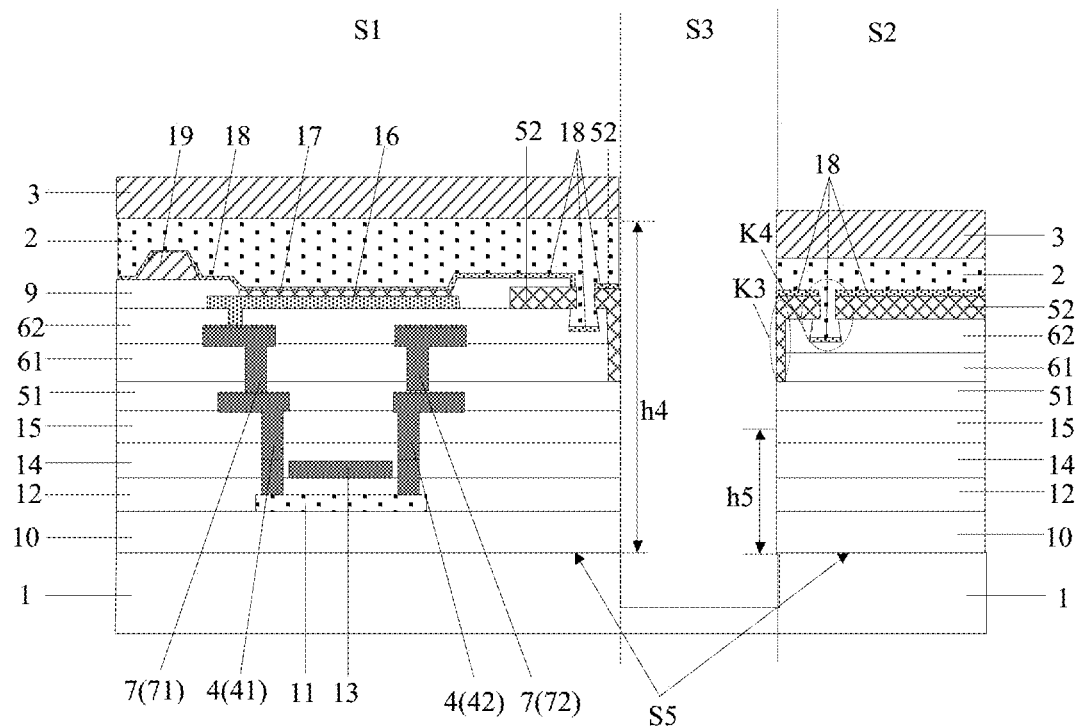
FIG. 6 is a schematic diagram of a distance relation between the organic packaging layer and a base substrate in different regions provided by an embodiment of the present disclosure.

In some embodiments, referring to FIG. 6, a distance h4, in the island regions S1, between one face of the organic packaging layer 3 facing the base substrate 1 and a first surface S5 is greater than a distance, in the bridge regions S2, between the face and the first surface S5, wherein the first surface S5 is a surface of the base substrate 1 facing the inorganic packaging layer 2.

Figure 7:
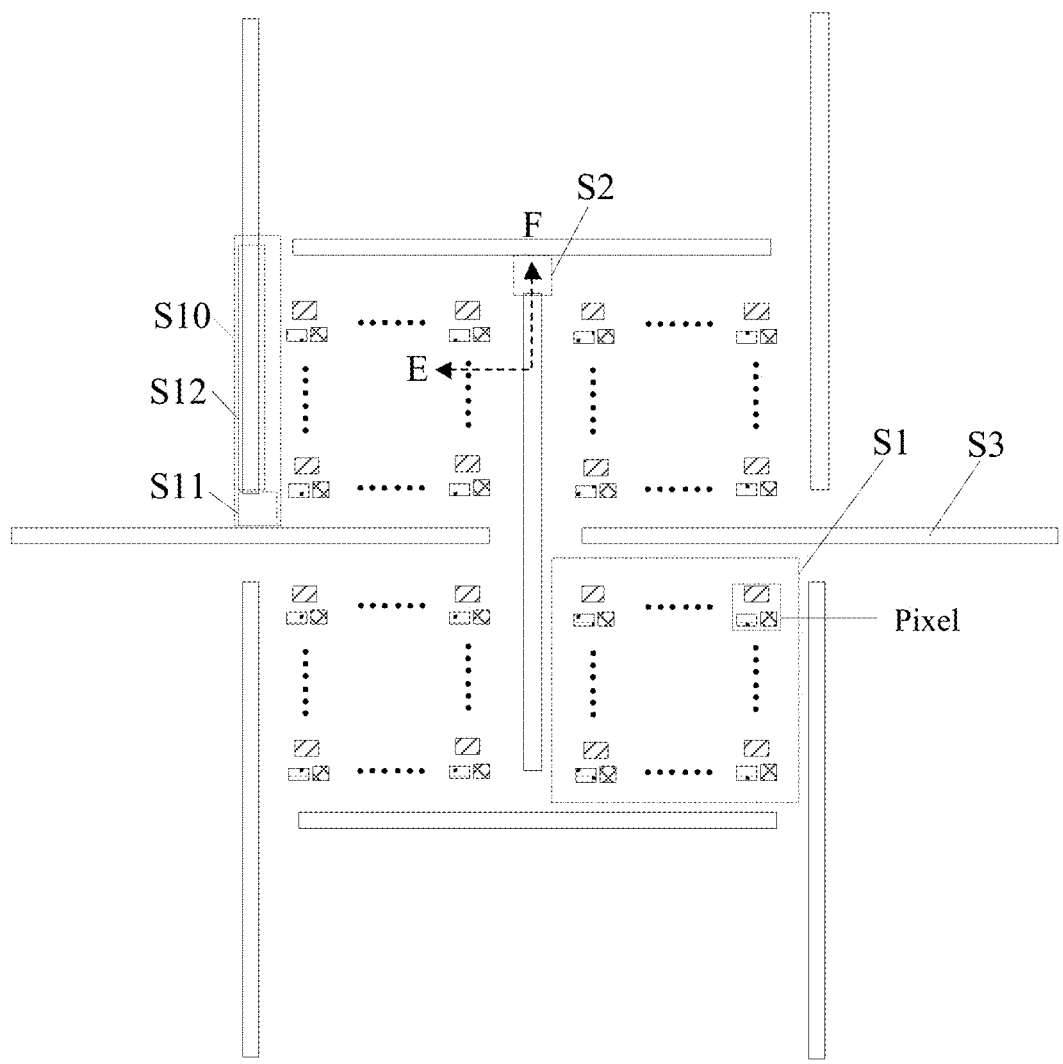
FIG. 7 is a schematic diagram of a relation between each side edge of each island region and other island regions provided by an embodiment of the present disclosure.

In some embodiments, referring to FIG. 7, each island region S1 is a rectangle, part S11 of at least one side edge S10 of the island region S1 (for example, a left side edge of the island region S1 at the upper left in FIG. 7) communicates with the adjacent island region Si (another island region S1 on the left side of the island region S1) through the bridge regions S2, and the rest part S12 is surrounded by the opening regions S3 with a same extension direction as the side edge S10. In some embodiments, for each side edge S10 of each island region S1, all the parts S11 communicate with the adjacent island regions S1 through the bridge regions S2, and the rest parts S12 are surrounded by the opening regions S3 with the same extension direction as the side edges S10.

Based on the same inventive concept, an embodiment of the present disclosure further provides a display apparatus, including the display panel provided by the embodiment of the present disclosure.

Figure 8:
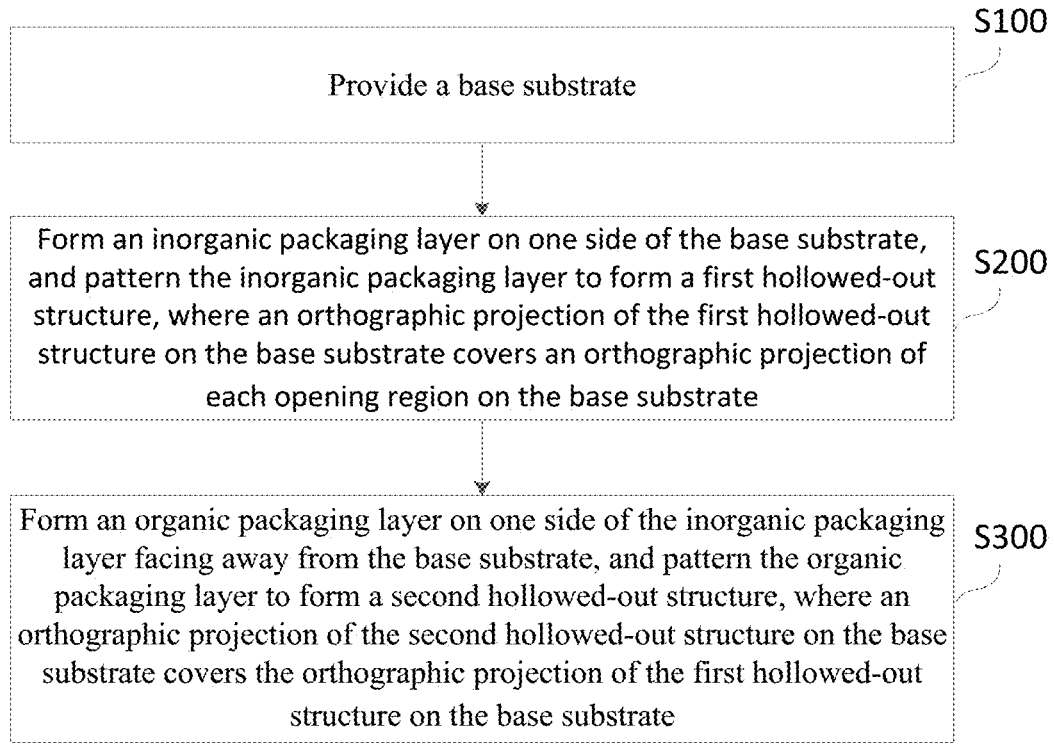
FIG. 8 is a schematic diagram of a manufacturing process of a display panel provided by an embodiment of the present disclosure.

Based on the same inventive concept, an embodiment of the present disclosure further provides a manufacturing method of the display panel provided by the embodiment of the present disclosure, referring to FIG. 8, the manufacturing method includes:

step S100, a base substrate is provided, wherein the base substrate includes a plurality of island regions, an opening region located between every two adjacent island regions, and a bridge region connecting every two adjacent island regions, and each island region has at least one pixel;

step S200, an inorganic packaging layer is formed on one side of the base substrate, and the inorganic packaging layer is patterned to form a first hollowed-out structure, wherein an orthographic projection of the first hollowed-out structure on the base substrate covers an orthographic projection of each opening region on the base substrate; in some embodiments, one side of the inorganic packaging layer facing away from the base substrate is coated with an optical adhesive layer, and the optical adhesive layer is patterned by adopting a photoetching process; and step S300, an organic packaging layer is formed on one side of the inorganic packaging layer facing away from the base substrate, and the organic packaging layer is patterned to form a second hollowed-out structure, wherein an orthographic projection of the second hollowed-out structure on the base substrate covers the orthographic projection of the first hollowed-out structure on the base substrate; and in some embodiments, an inorganic packaging thin film may be formed on one side of the base substrate, and the inorganic packaging layer is patterned by adopting a dry etching process.

Figure 3:
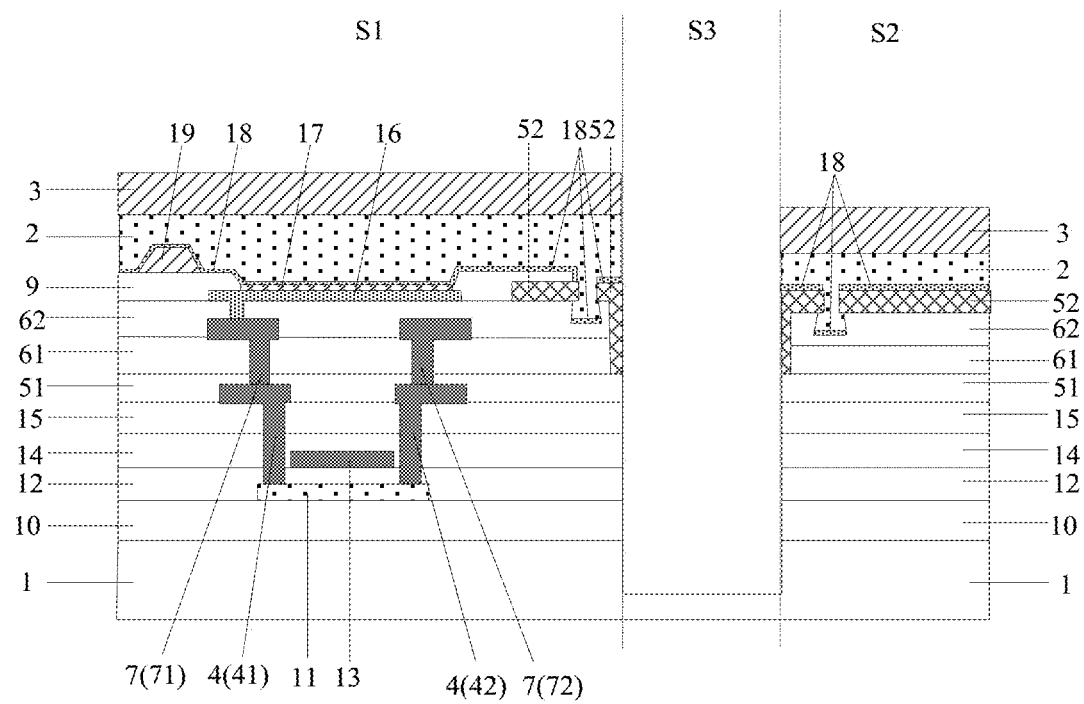
FIG. 3 is a schematic sectional view of a display panel having a first isolation groove provided by an embodiment of the present disclosure.
Figure 9:
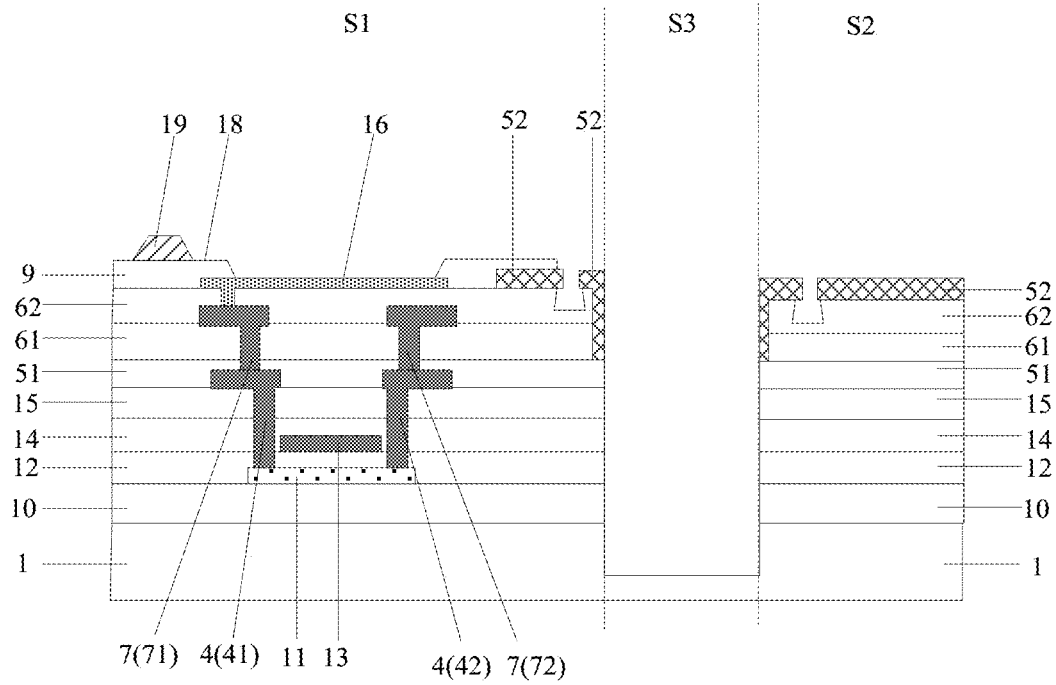
FIG. 9 is a schematic structural diagram of a display panel with a prepared pixel defining layer in an embodiment of the present disclosure.
Figure 10:
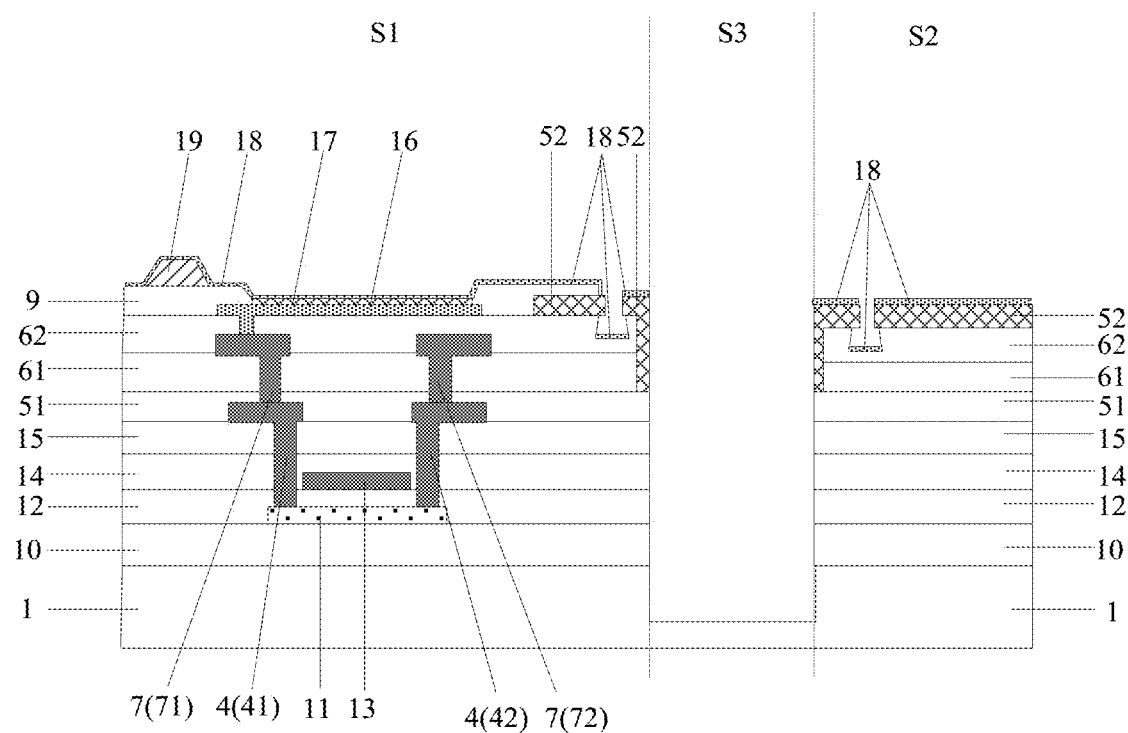
FIG. 10 is a schematic structural diagram of a display panel with a prepared cathode layer in an embodiment of the present disclosure.
Figure 11:
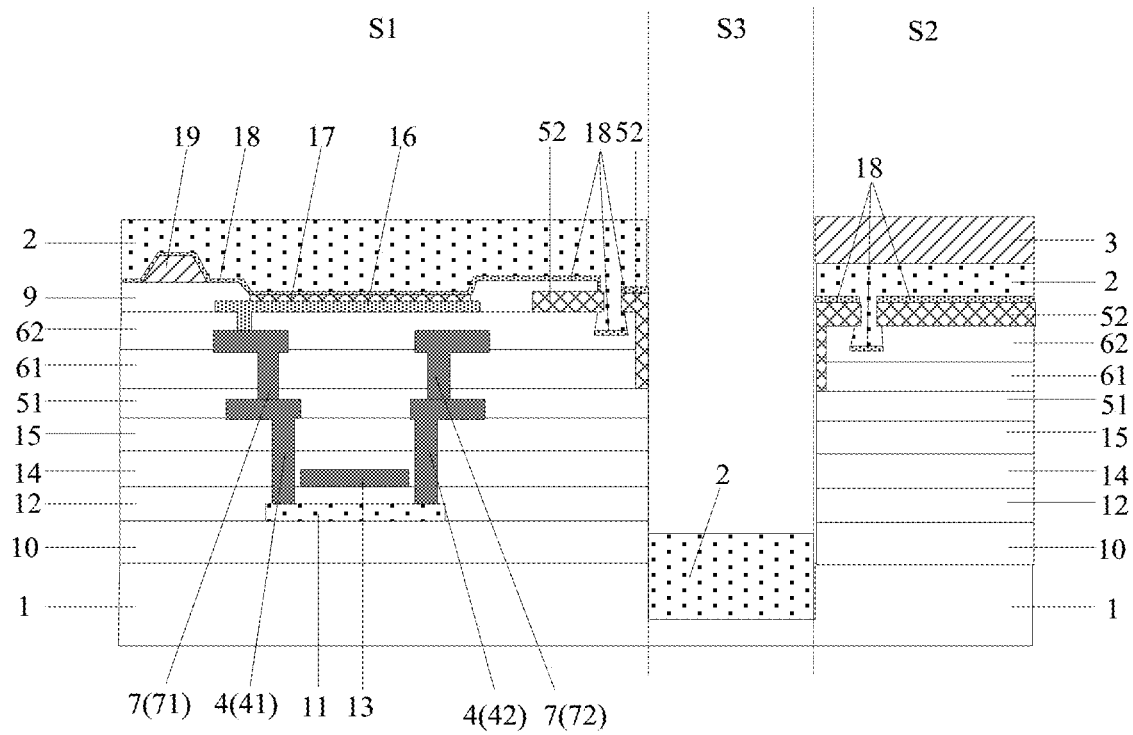
FIG. 11 is a schematic structural diagram of a display panel with a prepared inorganic packaging thin film in an embodiment of the present disclosure.
Figure 12:
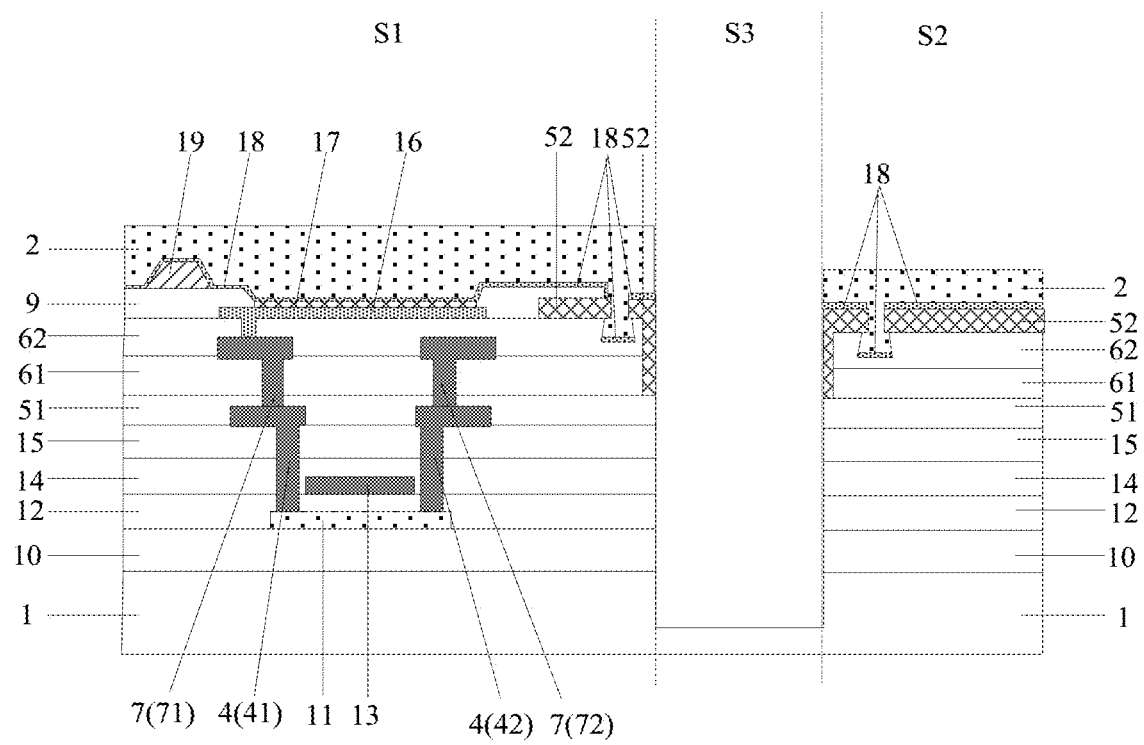
FIG. 12 is a schematic structural diagram of a display panel with a patterned inorganic packaging thin film in an embodiment of the present disclosure.

In order to understand the manufacturing method of the display panel provided by the embodiment of the present disclosure more clearly, the following is further described in detail with reference to FIG. 9 to FIG. 12:

step 1, a buffer layer 10, an active layer 11, a first gate insulation layer 12, a gate 13, a second gate insulation layer 14, an interlayer dielectric layer 15, a first metal layer 4 (In some embodiments may include a source 41 and a drain 42), a first passivation layer 51, a first planarization layer 61, a second metal layer 7 (may include a source overlapping electrode 71 and a drain overlapping electrode 72), a second planarization layer 62, a second passivation layer 52, an anode 16, a pixel defining layer 9, and a spacer 19 are sequentially formed in the island regions S1 on one side of the base substrate 1; at the same time, a buffer layer 10, a first gate insulation layer 12, a second gate insulation layer 14, an interlayer dielectric layer 15, a first passivation layer 51, a first planarization layer 61, a second planarization layer 62 and a second passivation layer 52 are sequentially formed in the bridge regions S2, as shown in FIG. 9;

step 2, the patterned organic light emitting layer 17 is evaporated on one side of the spacer 19 of the island regions S1 facing away from the pixel defining layer 9, and a cathode 18 is formed, as shown in FIG. 10;

step 3, an inorganic packaging thin film (namely the inorganic packaging layer 2 before patterning) covering the island regions S1, the bridge regions S2 and the opening regions S3 is formed by chemical vapor deposition (CVD), as shown in FIG. 11;

step 4, the inorganic packaging thin film is patterned by adopting the photoetching process to form the inorganic packaging layer 2, as shown in FIG. 12; and step 5, the organic packaging layer 3 is formed on one side of the inorganic packaging layer 2 facing away from the base substrate 1, and the organic packaging layer 3 is patterned, that is, the organic packaging layer 3 in the opening regions S3 is removed, as shown in FIG. 3.

The embodiments of the present disclosure have the beneficial effects that: in the embodiments of the present disclosure, the inorganic packaging layer has the first hollowed-out structure, and the orthographic projection of the first hollowed-out structure on the base substrate coincides with the orthographic projection of each opening region on the base substrate. Compared with the display panel packaged with only a whole layer of inorganic packaging layer, the problem that the inorganic packaging layer is prone to cracking in the opening regions when the display panel is stretched may occur. However, according to the display panel provided by the embodiment of the present disclosure, by removing the inorganic packaging layer of the opening regions, the problem that the inorganic packaging layer is prone to cracking in the opening regions when the display panel is stretched can be avoided. In addition, the organic packaging layer is further arranged on the side of the inorganic packaging layer facing away from the base substrate, the organic packaging layer has the second hollowed-out structure, the orthographic projection of the second hollowed-out structure on the base substrate coincides with the orthographic projection of the first hollowed-out structure on the base substrate, which can protect the inorganic packaging layer and reduce the probability of crack of the inorganic packaging layer covering the island regions and bridge regions. Moreover, the organic packaging layer and the inorganic packaging layer are also not arranged in the opening regions, which can ensure that the display panel has a good stretchable performance, and avoid the problem that the display panel is not easy to stretch when more film layers are arranged in the opening regions at the same time.

Obviously, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A display panel, comprising:
   a base substrate, comprising a plurality of island regions, an opening region arranged between adjacent island regions, and a bridge region connecting with adjacent island regions, wherein each of the plurality of island regions has at least one pixel;
   an inorganic packaging layer, disposed on a side of the base substrate, wherein the inorganic packaging layer covers the island regions and the bridge region and the inorganic packaging layer is provided with a first hollowed-out structure, an orthographic projection of the first hollowed-out structure on the base substrate covers an orthographic projection of the opening region on the base substrate; and
   an organic packaging layer, disposed on a side, facing away from the base substrate, of the inorganic packaging layer, wherein the organic packaging layer is provided with a second hollowed-out structure, and an orthographic projection of the second hollowed-out structure on the base substrate covers the orthographic projection of the first hollowed-out structure on the base substrate;
   wherein the base substrate is provided with a groove structure in the opening region; and
   in a direction perpendicular to the base substrate, a depth of the groove structure is smaller than a thickness of the base substrate.

2. The display panel according to claim 1, wherein the organic packaging layer is an optical adhesive layer.

3. The display panel according to claim 1, wherein a distance, in the island regions, between a face of the organic packaging layer facing the base substrate and a first surface is greater than a distance, in the bridge regions, between the face of the organic packaging layer facing the base substrate and the first surface;
   wherein the first surface is a surface, facing the inorganic packaging layer, of the base substrate.

4. The display panel according to claim 1, wherein between the base substrate and the inorganic packaging layer, the display panel in one island region of the plurality of island regions further comprises:
   a first metal layer;
   a first passivation layer, disposed on a side, facing away from the base substrate, of the first metal layer;
   a first planarization layer, disposed on a side, facing away from the first metal layer, of the first passivation layer;
   a second metal layer, disposed on a side, facing away from the first passivation layer, of the first planarization layer;
   a second planarization layer, disposed on a side, facing away from the first planarization layer, of the second metal layer; and a second passivation layer, disposed on a side, facing away from the second metal layer, of the second planarization layer;

wherein the second passivation layer is in contact with the first passivation layer through a first isolation groove penetrating through the second planarization layer and the first planarization layer at a boundary of the island region facing the opening region.

5. The display panel according to claim 4, wherein, between the base substrate and the inorganic packaging layer, the display panel in the one island region further comprises:

a pixel defining layer, disposed on a side, facing away from the second planarization layer, of the second passivation layer;

wherein, in a region between the boundary of the island region and a region where a pixel is located, the inorganic packaging layer is filled with a second isolation groove penetrating through the pixel defining layer, the second passivation layer and a part of the second planarization layer.

6. The display panel according to claim 5, wherein between the second planarization layer and the inorganic packaging layer, the display panel in the region where the pixel is located further comprises:

an anode; and an organic light emitting layer, arranged between the anode and the inorganic packaging layer.

7. The display panel according to claim 6, wherein, between the base substrate and the first metal layer, the display panel in the one island region further comprises:

a buffer layer;

an active layer, disposed on a side, facing away from the base substrate, of the buffer layer;

a first gate insulation layer, disposed on a side, facing away from the buffer layer, of the active layer;

a gate, disposed on a side, facing away from the active layer, of the first gate insulation layer;

a second gate insulation layer, disposed on a side, facing away from the first gate insulation layer, of the gate; and an interlayer dielectric layer, disposed on a side, facing away from the gate, of the second gate insulation layer.

8. The display panel according to claim 1, wherein, between the base substrate and the inorganic packaging layer, the display panel in the bridge region further comprises:

a first passivation layer;

a first planarization layer, disposed on a side, facing away from the base substrate, of the first passivation layer;

a second planarization layer, disposed on a side, facing away from the first passivation layer, of the first planarization layer; and a second passivation layer, disposed on a side, facing away from the first planarization layer, of the second planarization layer;

wherein the second passivation layer is in contact with the first passivation layer through a third isolation groove penetrating through the second planarization layer and the first planarization layer at a boundary of the bridge region facing the opening regions.

9. The display panel according to claim 8, wherein, between the base substrate and the inorganic packaging layer, the display panel in the bridge region further comprises:

the first planarization layer;

the second planarization layer, disposed on a side, facing away from the base substrate, of the first planarization layer; and the second passivation layer, disposed on the side, facing away from the first planarization layer, of the second planarization layer;

wherein the inorganic packaging layer in the bridge region is filled with a fourth isolation groove penetrating through the second passivation layer and a part of the second planarization layer.

10. The display panel according to claim 1, wherein one island region of the plurality of island regions is a rectangle, part of at least one side edge of the one island region communicates with an adjacent island region through the bridge region, and the rest part of the one island region is surrounded by the opening region with a same extension direction as the at least one side edge.

11. A display apparatus, comprising the display panel according to claim 1.

12. A manufacturing method of the display panel according to claim 1, comprising:

providing the base substrate, wherein the base substrate comprises the plurality of island regions, the opening region arranged between adjacent island regions, and the bridge region connecting with adjacent island regions, and each of the plurality of island regions has at least one pixel;

forming the inorganic packaging layer on the side of the base substrate, and patterning the inorganic packaging layer to form the first hollowed-out structure, wherein the orthographic projection of the first hollowed-out structure on the base substrate covers the orthographic projection of the opening region on the base substrate; and forming the organic packaging layer on the side, facing away from the base substrate, of the inorganic packaging layer, and patterning the organic packaging layer to form the second hollowed-out structure, wherein the orthographic projection of the second hollowed-out structure on the base substrate covers the orthographic projection of the first hollowed-out structure on the base substrate.

13. A display panel, comprising:

a base substrate, comprising a plurality of island regions, an opening region arranged between adjacent island regions, and a bridge region connecting with adjacent island regions, wherein each of the plurality of island regions has at least one pixel;

an inorganic packaging layer, disposed on a side of the base substrate, wherein the inorganic packaging layer covers the island regions and the bridge region and the inorganic packaging layer is provided with a first hollowed-out structure, an orthographic projection of the first hollowed-out structure on the base substrate covers an orthographic projection of the opening region on the base substrate; and an organic packaging layer, disposed on a side, facing away from the base substrate, of the inorganic packaging layer, wherein the organic packaging layer is provided with a second hollowed-out structure, and an orthographic projection of the second hollowed-out structure on the base substrate covers the orthographic projection of the first hollowed-out structure on the base substrate;

wherein between the base substrate and the inorganic packaging layer, the display panel in one island region of the plurality of island regions further comprises:
a first metal layer;
a first passivation layer, disposed on a side, facing away from the base substrate, of the first metal layer;
a first planarization layer, disposed on a side, facing away from the first metal layer, of the first passivation layer;
a second metal layer, disposed on a side, facing away from the first passivation layer, of the first planarization layer;
a second planarization layer, disposed on a side, facing away from the first planarization layer, of the second metal layer; and
a second passivation layer, disposed on a side, facing away from the second metal layer, of the second planarization layer;
wherein the second passivation layer is in contact with the first passivation layer through a first isolation groove penetrating through the second planarization layer and the first planarization layer at a boundary of the island region facing the opening region.

14. The display panel according to claim 13, wherein, between the base substrate and the inorganic packaging layer, the display panel in the one island region further comprises:
a pixel defining layer, disposed on a side, facing away from the second planarization layer, of the second passivation layer;
wherein, in a region between the boundary of the island region and a region where a pixel is located, the inorganic packaging layer is filled with a second isolation groove penetrating through the pixel defining layer, the second passivation layer and a part of the second planarization layer.

15. The display panel according to claim 14, wherein between the second planarization layer and the inorganic packaging layer, the display panel in the region where the pixel is located further comprises:
an anode; and
an organic light emitting layer, arranged between the anode and the inorganic packaging layer.

16. The display panel according to claim 15, wherein, between the base substrate and the first metal layer, the display panel in the one island region further comprises:
a buffer layer;
an active layer, disposed on a side, facing away from the base substrate, of the buffer layer;
a first gate insulation layer, disposed on a side, facing away from the buffer layer, of the active layer;
a gate, disposed on a side, facing away from the active layer, of the first gate insulation layer;
a second gate insulation layer, disposed on a side, facing away from the first gate insulation layer, of the gate; and
an interlayer dielectric layer, disposed on a side, facing away from the gate, of the second gate insulation layer.

17. The display panel according to claim 13, wherein one island region of the plurality of island regions is a rectangle, part of at least one side edge of the one island region communicates with an adjacent island region through the bridge region, and the rest part of the one island region is surrounded by the opening region with a same extension direction as the at least one side edge.

18. A display panel, comprising:
a base substrate, comprising a plurality of island regions, an opening region arranged between adjacent island regions, and a bridge region connecting with adjacent island regions, wherein each of the plurality of island regions has at least one pixel;
an inorganic packaging layer, disposed on a side of the base substrate, wherein the inorganic packaging layer covers the island regions and the bridge region and the inorganic packaging layer is provided with a first hollowed-out structure, an orthographic projection of the first hollowed-out structure on the base substrate covers an orthographic projection of the opening region on the base substrate; and
an organic packaging layer, disposed on a side, facing away from the base substrate, of the inorganic packaging layer, wherein the organic packaging layer is provided with a second hollowed-out structure, and an orthographic projection of the second hollowed-out structure on the base substrate covers the orthographic projection of the first hollowed-out structure on the base substrate;
wherein, between the base substrate and the inorganic packaging layer, the display panel in the bridge region further comprises:
a first passivation layer;
a first planarization layer, disposed on a side, facing away from the base substrate, of the first passivation layer;
a second planarization layer, disposed on a side, facing away from the first passivation layer, of the first planarization layer; and
a second passivation layer, disposed on a side, facing away from the first planarization layer, of the second planarization layer;
wherein the second passivation layer is in contact with the first passivation layer through a third isolation groove penetrating through the second planarization layer and the first planarization layer at a boundary of the bridge region facing the opening regions.

19. The display panel according to claim 18, wherein, between the base substrate and the inorganic packaging layer, the display panel in the bridge region further comprises:
the first planarization layer;
the second planarization layer, disposed on a side, facing away from the base substrate, of the first planarization layer; and
the second passivation layer, disposed on the side, facing away from the first planarization layer, of the second planarization layer;
wherein the inorganic packaging layer in the bridge region is filled with a fourth isolation groove penetrating through the second passivation layer and a part of the second planarization layer.

20. The display panel according to claim 18, wherein a distance, in the island regions, between a face of the organic packaging layer facing the base substrate and a first surface is greater than a distance, in the bridge region, between the face of the organic packaging layer facing the base substrate and the first surface;
wherein the first surface is a surface, facing the inorganic packaging layer, of the base substrate.

* * * * *